United States Patent [19]
Hendrix

[11] Patent Number: 5,603,376
[45] Date of Patent: Feb. 18, 1997

[54] HEAT EXCHANGER FOR ELECTRONICS CABINET

[75] Inventor: Walter M. Hendrix, Richardson, Tex.

[73] Assignee: Fujitsu Network Communications, Inc., Richardson, Tex.

[21] Appl. No.: 297,913

[22] Filed: Aug. 31, 1994

[51] Int. Cl.$^6$ .................................................. F28D 15/00
[52] U.S. Cl. ..................... 165/104.34; 165/185; 361/724
[58] Field of Search .................... 165/104.34, 104.33, 165/185, 182, 122, 181, 53, 918, 165, 80.3, 166, 54, 152; 219/400, 399, 218, 214; 312/236; 361/710, 724, 709, 714, 696, 697

[56] References Cited

U.S. PATENT DOCUMENTS

| | | | |
|---|---|---|---|
| 1,242,652 | 10/1917 | Capell | 165/152 |
| 1,669,192 | 6/1926 | Fischer | 219/399 |
| 2,695,352 | 10/1952 | Dekold | 219/218 X |
| 3,553,426 | 1/1971 | Fink | 219/218 X |
| 3,658,075 | 4/1972 | Jacobs | 165/104.21 X |
| 3,804,159 | 4/1974 | Searight et al. | 165/182 X |
| 3,901,312 | 8/1975 | Pasternak | 165/181 |
| 4,365,665 | 12/1982 | Nakamura | 165/80.3 |
| 4,461,344 | 7/1984 | Allen et al. | 165/165 X |
| 4,631,635 | 12/1986 | Dolbeare | 165/69 |
| 4,646,817 | 3/1987 | Van Ee | 165/122 X |
| 4,693,307 | 9/1987 | Scarselletta | 165/152 |
| 4,706,739 | 11/1987 | Noren | 165/104.33 X |
| 4,777,560 | 10/1988 | Herrell et al. | 165/80.3 X |
| 4,794,982 | 1/1989 | Corkigian | 165/104.33 |
| 4,807,441 | 2/1989 | Agee et al. | 165/166 |
| 4,817,709 | 4/1989 | Esformes | 165/182 X |
| 4,840,221 | 6/1989 | Dumas et al. | 165/122 X |
| 4,944,344 | 7/1990 | Crowe | 165/104.33 |
| 4,949,218 | 8/1990 | Blanchard et al. | 165/104.33 X |
| 4,958,504 | 9/1990 | Ichikawa | 165/122 X |
| 4,991,646 | 2/1991 | Spears | 165/122 |
| 5,054,545 | 10/1991 | Ghaemian | 165/104.33 |
| 5,180,001 | 1/1993 | Okada et al. | 165/185 X |
| 5,282,507 | 2/1994 | Tongu et al. | 165/165 |

FOREIGN PATENT DOCUMENTS

| | | | |
|---|---|---|---|
| 2744664 | 4/1979 | Germany . | |
| 0085049 | 6/1980 | Japan | 165/185 |
| 0142199 | 7/1985 | Japan | 165/166 |
| 3271696 | 12/1991 | Japan | 165/166 |
| 4214195 | 8/1992 | Japan | 165/185 |

OTHER PUBLICATIONS

J. R. McKay, "The Effect of Solar Radiation and Wind Speed on Air Temperature Rise in Outdoor Cabinets Containing Telephone Equipment", *INTELEC—Tenth International Telecommunications Energy Conference*, No. 10–3, pp. 285–291 (IEEE Catalog No. CH2643-4), 1988.

J. R. McKay, "Use of an Air–to–Air Heat Exchanger to Reduce Peak Temperatures in Outdoor Cabinets", *INTELEC—Twelfth International Telecommunications Energy Conference*, No. 25–5, pp. 584–588 (IEEE Catalog No. CH2928-0), 1990.

T. W. Bradley et al., "Gas/Gas Heat Exchanger", *IBM Technical Disclosure Bulletin*, vol. 13, No. 8, Jan. 1971.

*Primary Examiner*—John Rivell
*Assistant Examiner*—Christopher Atkinson
*Attorney, Agent, or Firm*—Staas & Halsey

[57] ABSTRACT

A heat exchanger for passive heat exchange between a weather-tight, sealed electronics cabinet for exchanging heat between a heat generating side of a separating plate and an exhaust side of the separating plate is provided. The heat exchanger includes at least one layer of heat exchanger fins running in a first direction, on the heat generating side of the separating plate. The heat exchanger also includes a plurality of layers of heat exchanger fins running in a second direction, generally perpendicular to the first direction, on the exhaust side of the separating plate. The heat exchangers are sealed with a continuous gasket in the top of a cabinet housing electronic equipment.

11 Claims, 3 Drawing Sheets

HEAT EXCHANGER FOR ELECTRONICS CABINET

BACKGROUND OF THE INVENTION

1. Field of the Invention

The present invention relates to heat exchangers in general, and more particularly, to heat exchangers adapted for use in cooling sealed electronics cabinets.

2. Description of the Related Art

Electronic equipment, such as telecommunications loop electronic equipment, is often housed in customized cabinets. The cabinets are generally placed out-of-doors, simply mounted on a concrete pad. Thus, the cabinets must be weather resistant and sealed to keep out water. The electronic components housed in the cabinet produce heat when operating. Therefore, a cooling system is required to remove the heat from the cabinets.

In U.S. Pat. No. 4,949,218 to Blanchard et al., which is hereby incorporated by reference in its entirety for all purposes, one such cabinet is proposed. As can be seen in FIG. 1, the Blanchard et al. cabinet 1 has an interior chamber 3 for housing electronic equipment. To cool the electronic equipment, heat exchangers 5 are provided. The cabinet 1 is sealed, having a top formed by diagonal plates 7 and longitudinal plate 9. Each of the heat exchangers 5 have a portion within the sealed cabinet and a portion within an air duct. As can be seen in FIG. 1, air vents 11 are provided, and fans 13 move air through the air vents, past the heat exchangers 5. The fans 13 are propeller fans. The system is a passive, closed system which does not introduce outside air and its associated moisture and contaminants into the interior chamber 3. The heat exchangers 5 of Blanchard et al. are extruded heat exchangers.

The design of the cooling system for the cabinet described above is deficient in that the heat transfer surface area of the heat exchangers 5 is limited by the extrusion fabrication process. Also, the cooling fins can be oriented only in the direction of extrusion. In addition, heat transfer enhancement features such as fin perforations or lances cannot be incorporated. Moreover, the propeller fans 13 have limited air flow rate capacity past the heat exchangers 5 as compared to some other types of fans.

Besides the heat exchanger cooling system disclosed in Blanchard et al., other heat exchanger cooling systems have been proposed. However, the heat exchangers of such systems generally do not meet the stringent design requirements of Bell Communications Research (Bellcore). These requirements include the ability to withstand harsh outdoor weather conditions. However, previous heat exchangers do not have optimal sealing between the exhaust side and the heat generating side.

Further, previous heat exchangers generally employ an epoxy resin for sealing the layers of heat exchanger fins to one another and to a separating plate. However, there are numerous problems associated with the use of epoxies, including decreased thermal conductivity. Also, because the coefficient of thermal expansion for adhesives, including epoxy adhesives, is quite different than that for the metal heat exchanger fins, an epoxy adhesive seal is susceptible to cracking or moisture retention.

SUMMARY OF THE INVENTION

It is an object of the present invention to overcome the above-discussed deficiencies. More specifically, it is an object of the present invention to provide a heat exchanger for passive heat exchange between a weather-tight, sealed electronics cabinet and the outside environment.

According to the present invention, a heat exchanger for exchanging heat between a heat generating side of a separating plate and an exhaust side of the separating plate is provided. The heat exchanger includes at least one layer of heat exchanger fins running in a first direction, on the heat generating side of the separating plate. The heat exchanger also includes a plurality of layers of heat exchanger fins running in a second direction, generally perpendicular to the first direction, on the exhaust side of the separating plate. The heat exchanger is sealed with a continuous gasket in the top of a cabinet housing electronic equipment.

BRIEF DESCRIPTION OF THE DRAWINGS

Hereinafter, a preferred embodiment of the invention will be described with reference to the accompanying drawings, in which.

DETAILED DESCRIPTION OF THE PREFERRED EMBODIMENT

Figure 2:
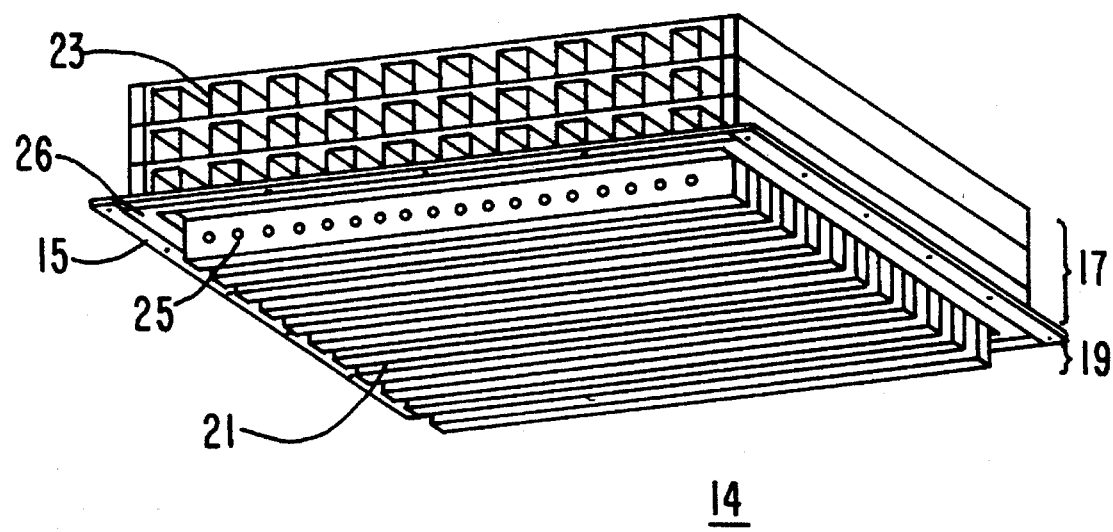
FIG. 2 is a perspective view of a heat exchanger according to the present invention.

FIG. 2 is a perspective view of a heat exchanger 14 according to the present invention. As shown in FIG. 2, the heat exchanger 14 includes a separating plate 15 to separate an exhaust side 17 of the heat exchanger 14 from a heat generating side 19 of the heat exchanger. The heat exchanger 14 has at least one layer of heat exchanger fins 21 on the heat generating side 19 of the separating plate 15. Also provided are a plurality of layers of heat exchanger fins 23 on the exhaust side 17 of the separating plate 15. The heat exchanger fins 21 on the heat generating side 19 run in a first direction, while the heat exchanger fins 23 on the exhaust side 17 run in a second direction, generally perpendicular to the first direction. As can be seen in FIG. 2, the heat exchanger fins 21, 23 are in the form of sheet metal folded back and forth in a pleated configuration. In this manner, an increased surface area is provided.

At least one layer of heat exchanger fins are perforated in a direction perpendicular to the directions of the folds. As shown in FIG. 2, preferably the heat generating fins 21 on the heat generating side 19 of the separating plate 15 are perforated with perforations 25. The perforations can be formed by manufacturers such as Robinson Fin Machines, Inc. of Canton, Ohio. By having perforated fins, thermal boundary layers are redeveloped, thus increasing the heat transfer coefficient. It was found that the use of perforated fins increases the efficiency of the thermal system by about 30% for the heat exchanger fins 21 on the heat generating side 19 (internal). The separating plate 15 is attached to the adjacent layers of heat exchanger fins 21, 23 by vacuum brazing. Also, the heat exchanger fins 23 on the exhaust side 17 are vacuum brazed to one another. In vacuum brazing, flux is not used, and aluminum assemblies are first precleaned to remove their natural surface oxides. The aluminum assemblies are then heated to a relatively high temperature, e.g., 1100° F., in a dry, inert gas vacuum environment. Again, no brazing flux is used. The brazing process is performed with conventional equipment, such as that used by Adcor Vacuum and Dip Brazing Specialists of Brookfield, Illinois. Included in the equipment is a furnace chamber in which an environment is created which fractures existing aluminum oxide films and melts aluminum filler metals. The environment also inhibits formation of new oxides. In the furnace, molten aluminum filler metals are free to flow by capillary action, creating solidly brazed joints between mating parts.

The brazing process creates an intermetallic bond between the parent and filler metals, allowing for a chemical conversion coat secondary finish over the entire finished part. The secondary finish provides excellent corrosion resistance for the environment in which the cabinet is to be used. Moreover, the filler metal joints of vacuum brazing are capable of providing a continuous hermetic seam. Because epoxy resin adhesives are not employed, the seam is less susceptible to cracking and moisture retention. Reference numeral 26 denotes a continuous gasket for sealing the heat exchanger 14.

Vacuum brazing increases the thermal conductivity of the heat exchanger as a whole because the filler material (which may be aluminum) has a much higher thermal conductivity than non-metal adhesives such as epoxy resins.

Figure 3:
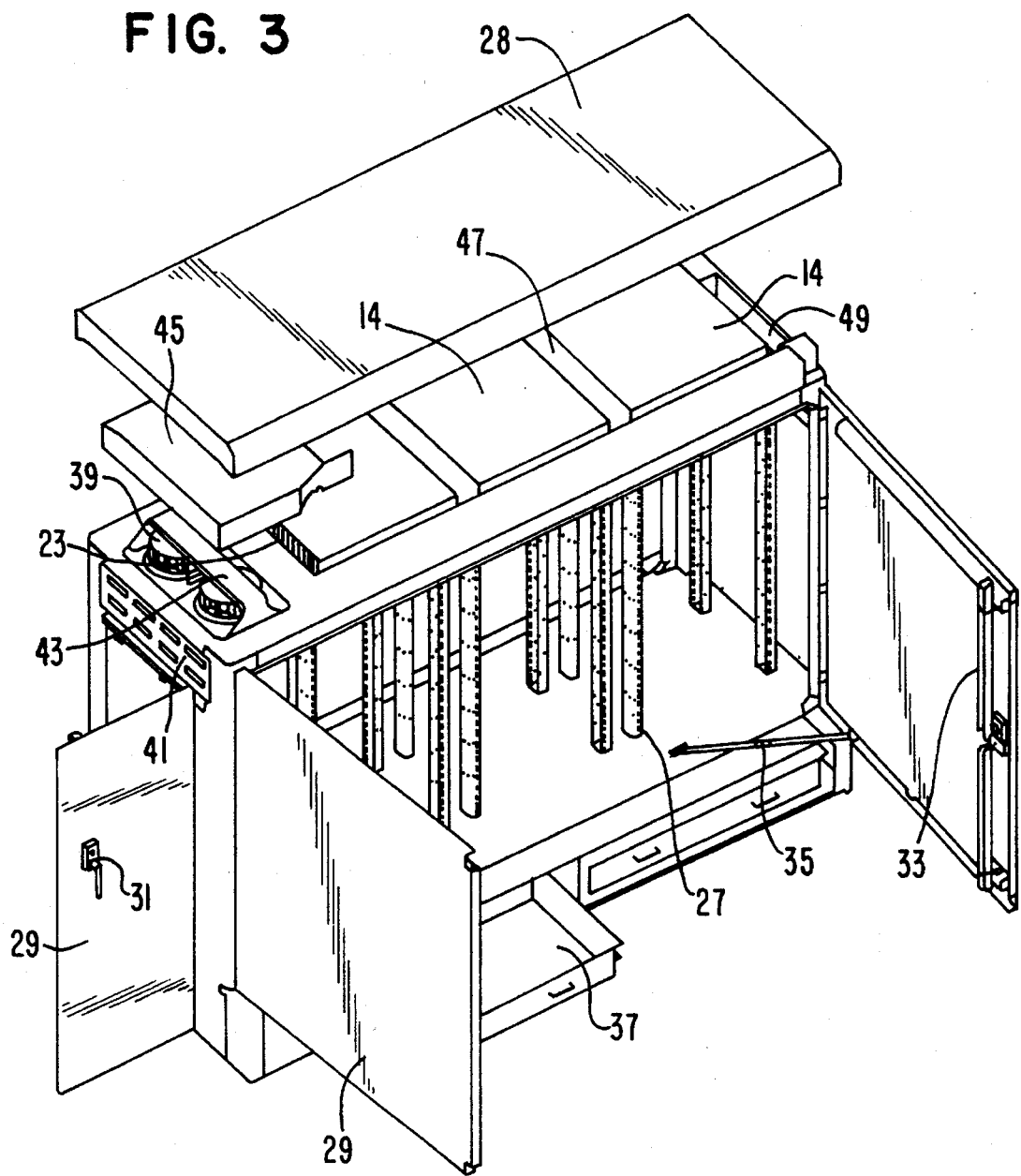
FIG. 3 is a perspective view of a cabinet for housing electronic equipment in which the heat exchanger of FIG. 2 can be used.

FIG. 3 is a perspective view of a cabinet for housing electronic equipment, in which the heat exchanger 14 shown in FIG. 2 can be used. Electronic equipment is supported by equipment racks 27 within the cabinet. The upper portion of the cabinet is covered by top 28. Doors 29 enclose the front and side of the cabinet, and are opened with handles 31. A door latching mechanism 33 and door restraint mechanism 35 are also provided. In the base portion of the cabinet are drawers 37, which may be used to store one or more batteries.

As shown in FIG. 3, impeller fans 39 are provided for moving air past the heat exchanger fins 23 on the exhaust side. Preferably, two impeller fans 39 are provided. Impeller fans 39 pull air in through the air inlet, which is covered by a perforated covering 41. The air inlet is below the impeller fans 39. A fan support 43 partially encloses the impeller fans 39. A fan duct 45 directs the air exiting the impeller fans 39 through the fins 23. Heat exchanger ducts 47 channel air from one heat exchanger 14 to the adjacent heat exchanger 14. An exit duct 49 channels air from the last heat exchanger down and out of the cabinet through the side opposite the side from which air enters.

Four remote temperature sensors (not shown) are located above the racks of electronic equipment. The remote temperature sensors work together with a thermal control module (not shown) to activate the impeller fans 39. For example, the impeller fans 39 may operate simultaneously and be turned on when any of the temperature sensors reach 55° C. The impeller fans 39 will then operate for some minimum amount of time, and preferably at least 15 minutes, until the temperature within the cabinet drops a predetermined amount, preferably 10° C. For internal air flow, fans may be housed in fan trays above each rack of electronic equipment. Two fans may be contained in each fan tray. Each fan pulls air upward, through the electronics racks. The hot exhaust air exiting the fan impinges on the heat exchanger fins 21 to cool the air. The air then circulates downward and re-enters the electronics racks.

With regard to the impeller fans 39 themselves, any of several conventional motorized impeller fans may be used. By using an impeller, rather than a propeller, which was previously used, air flow is increased relative to fan size and power consumption is decreased. Power consumption is particularly important when the electronic equipment is forced to run on emergency back-up batteries.

The cooling system is designed to withstand extreme heat conditions, such as those found in South Florida. According to one design, the maximum cabinet heat load is 3533 Watts. This is the sum of the maximum electronic equipment heat load and the maximum solar heat load.

Figure 1:
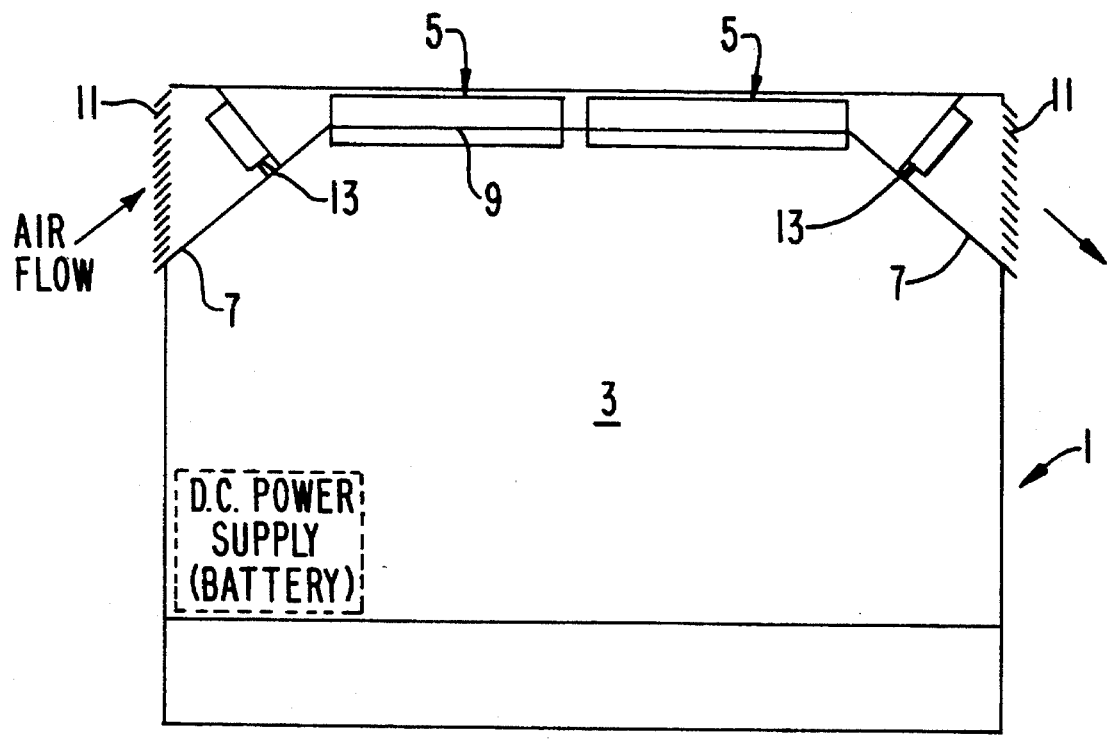
FIG. 1 is a schematic view of a known cabinet for housing electronic equipment.
Figure 4:
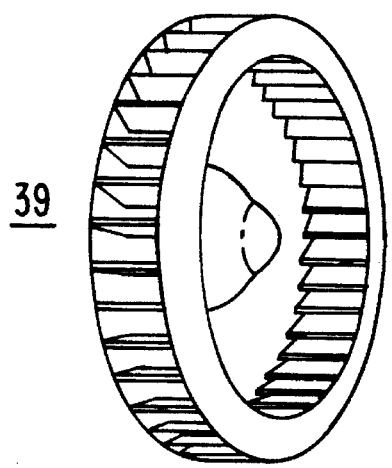
FIG. 4 a perspective view of an impeller used in the cabinet shown in FIG. 3.

FIG. 4 shows an example of an impeller for impeller fans 39.

One embodiment of the present invention has been described above. However, the present invention is not limited to this embodiment, but variations and modifications may be made without departing from the scope of the present invention as defined by the appended claims.

What is claimed is:

1. A heat exchanger for cooling electronics equipment stored in a cabinet having isolated air in an interior chamber, comprising:

a separating plate having a heat generating side and an external air side, the separating plate defining a separating plane such that substantially none of the isolated air in the interior chamber is found on the external air side of the separating plate;

at least one layer of heat exchanger fins running in a first direction, on the heat generating side of the separating plate;

a plurality of layers of heat exchanger fins running in a second direction, generally perpendicular to the first direction, on the external air side of the separating plate: and a fan positioned to move air in the second direction through the plurality of layers of heat exchanger fins on the external air side of the separating plate.

2. A heat exchanger according to claim 1, wherein the heat exchanger fins are in the form of sheet metal folded in a pleated configuration.

3. A heat exchanger according to claim 2, wherein at least one layer of heat exchanger fins are perforated in a direction generally perpendicular to the direction of the folds in the metal.

4. A heat exchanger according to claim 3, wherein at least one layer of heat exchanger fins on the heat generating side of the separating plate are perforated.

5. A heat exchanger according to claim 1, wherein the separating plate is vacuum brazed to layers of heat exchanger fins and the plurality of layers of heat exchanger fins on the external air side of the separating plate are vacuum brazed to one another.

6. A heat exchanger according to claim 1, wherein the fan is a motorized impeller having an inlet for air intake and an outlet, the outlet forcing air radially outward across a plane normal to the inlet.

7. A cabinet housing electronic equipment, comprising:

a base portion;

a plurality of side walls upstanding from the base portion forming an interior chamber having isolated air for mounting electronic equipment which is capable of producing heat when operating;

a top covering the plurality of sidewalls, the top having at least one opening therein;

at least one heat exchanger fitting respectively in said at least one opening, each heat exchanger comprising:

a separating plate fitting on the opening in the top, opposite the interior chamber, the separating plate having a heat generating side and an external air side, the separating plate defining a separating plane such that substantially none of the isolated air in the interior chamber is found on the external air side of the separating plate;

at least one layer of heat exchanger fins running in a first direction, on the heat generating side of the separating plate, within the interior chamber;

a plurality of layers of heat exchanger fins running in a second direction, generally perpendicular to the first direction, on the external air side of the separating plate;

a continuous gasket surrounding a periphery of the opening in the top, in sealing relation between the top and the separating plate; and a fan positioned to move air in the second direction through the plurality of layers of heat exchanger fins on the external air side of the separating plate.

8. A cabinet housing electronic equipment according to claim 7, further comprising at least one interior fan within the interior chamber, the interior fan arranged to force air past the electronic equipment to impinge on at least one layer of heat exchanger fins on the heat generating side of the separating plate.

9. A cabinet housing electronic equipment according to claim 7, wherein the base portion is adapted for housing at least one back-up battery.

10. A cabinet housing electronic equipment according to claim 7, wherein all layers of heat exchanger fins running in the second direction are on the external air side of the separating plate.

11. A heat exchanger according to claim 7, wherein the fan is a motorized impeller having an inlet for air intake and an outlet, the outlet forcing air radially outward across a plane normal to the inlet.

\* \* \* \* \*